(12) United States Patent
Rops et al.

(10) Patent No.: US 12,429,778 B2
(45) Date of Patent: Sep. 30, 2025

(54) FLUID HANDLING SYSTEM, METHOD AND LITHOGRAPHIC APPARATUS

(71) Applicant: ASML NETHERLANDS B.V., Veldhoven (NL)

(72) Inventors: Cornelius Maria Rops, Waalre (NL); Erik Henricus Egidius Catharina Eummelen, Veldhoven (NL); Giovanni Luca Gattobigio, Eindhoven (NL); Christianus Wilhelmus Johannes Berendsen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 126 days.

(21) Appl. No.: 18/252,776

(22) PCT Filed: Oct. 22, 2021

(86) PCT No.: PCT/EP2021/079380
§ 371 (c)(1),
(2) Date: May 12, 2023

(87) PCT Pub. No.: WO2022/111919
PCT Pub. Date: Jun. 2, 2022

(65) Prior Publication Data
US 2023/0418165 A1   Dec. 28, 2023

(30) Foreign Application Priority Data

Nov. 25, 2020   (EP) ..................................... 20209779

(51) Int. Cl.
*G03F 7/00*   (2006.01)
(52) U.S. Cl.
CPC ............... *G03F 7/70341* (2013.01)

(58) Field of Classification Search
CPC .................................................. G03F 7/70341
See application file for complete search history.

(56) References Cited

U.S. PATENT DOCUMENTS 6,952,253 B2   10/2005   Lof et al.
7,199,874 B2   4/2007   Bevis et al.
(Continued)

FOREIGN PATENT DOCUMENTS

| JP | 2011014901 | 1/2011 |
| NL | 2025219 | 5/2020 |

(Continued)

OTHER PUBLICATIONS

International Search Report dated Feb. 14, 2022, issued in corresponding PCT Patent Application No. PCT/EP2021/079380 (2 pgs.).

(Continued)

*Primary Examiner* — Hung V Nguyen
(74) *Attorney, Agent, or Firm* — Pillsbury Winthrop Shaw Pittman, LLP

(57) ABSTRACT

Disclosed herein is a fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a damper arranged between a first extraction member and a second extraction member both configured to extract fluid; wherein the damper is configured to support a meniscus of the immersion liquid between a surface of the damper and the surface of the substrate.

20 Claims, 7 Drawing Sheets

(56) References Cited

U.S. PATENT DOCUMENTS

| | | |
|---|---|---|
| 8,472,003 B2 | 6/2013 | Patel et al. |
| 8,587,762 B2 | 11/2013 | Streefkerk et al. |
| 9,625,829 B2 * | 4/2017 | Bessems ............. G03F 7/70341 |
| 10,620,544 B2 * | 4/2020 | Cortie ................. G03F 7/70341 |
| 2009/0086175 A1 | 4/2009 | Streefkerk et al. |
| 2010/0259735 A1 | 10/2010 | Eummelen et al. |
| 2011/0005603 A1 | 1/2011 | Patel et al. |
| 2013/0100425 A1 | 4/2013 | Riepen |
| 2016/0306283 A1 | 10/2016 | Direcks |

FOREIGN PATENT DOCUMENTS

| | | |
|---|---|---|
| TW | 200921294 | 5/2009 |
| WO | 99/49504 | 9/1999 |
| WO | 2019/115197 | 6/2019 |

OTHER PUBLICATIONS

Written Opinion of the International Searching Authority dated Feb. 14, 2022, issued in corresponding PCT Patent Application No. PCT/EP2021/079380 (5 pgs.).

\* cited by examiner

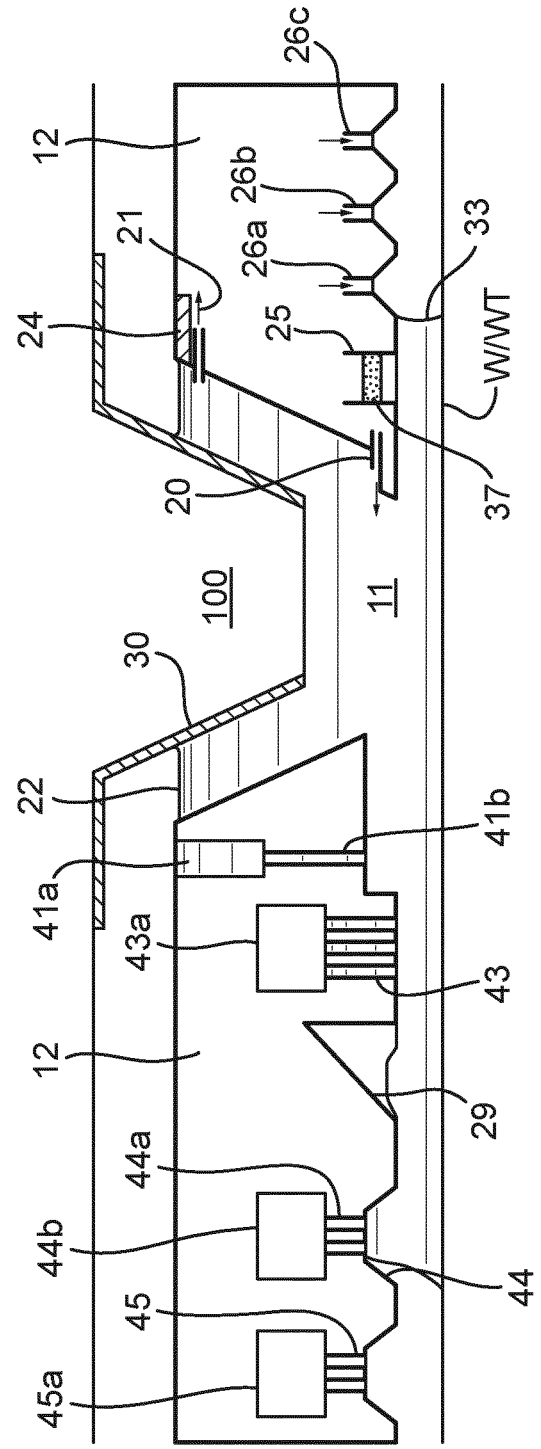

FLUID HANDLING SYSTEM, METHOD AND LITHOGRAPHIC APPARATUS

CROSS-REFERENCE TO RELATED APPLICATIONS

This application is the U.S. national phase entry of PCT Patent Application No. PCT/EP2021/079380 which was filed on Oct. 22, 2021, which claims priority of European Patent Application No. 20209779.6 which was filed on Nov. 25, 2020 and which is incorporated herein in its entirety by reference.

FIELD

The present invention relates to a fluid handling system and a device manufacturing method. The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. The use of such immersion fluid can lead to the presence of droplets on the surface of the substrate. Such droplets can be an issue because they can cause drying spots on the substrate and because when a droplet hits a meniscus of immersion liquid, this can lead to formation of a bubble due to entrapped gas in the immersion liquid. A bubble in the immersion liquid can lead to printed defects on the substrate. The likelihood of such bubbles being introduced can be reduced by reducing the relative speed of the substrate, however, this limits the throughput of the lithographic apparatus.

SUMMARY

It is an object of the present invention to provide a fluid handling system and method in which measures are taken to increase throughput and/or reduce defects on a substrate.

According to a first aspect of the present invention, there is provided a fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a damper arranged between a first extraction member and a second extraction member both configured to extract fluid; wherein the damper is configured to support a meniscus of the immersion liquid between a surface of the damper and the surface of the substrate.

According to a second aspect of the invention, there is provided a lithographic apparatus comprising the fluid handling system of the first aspect.

According to a third aspect of the invention, there is provided a device manufacturing method in a lithographic apparatus having a substrate holder configured to hold a substrate, a projection system configure to project a radiation beam onto the substrate held by the substrate holder, and a fluid handling system according to the first aspect, the method comprising: using the fluid handling system to confine immersion liquid to the space between at least a part of the fluid handling system and the surface of the substrate; projecting a patterned beam of radiation onto the substrate through the immersion liquid in the space; supporting a meniscus of the immersion liquid between a surface of a damper and the substrate; and moving the substrate in a scan direction substantially perpendicular to the direction of propagation of the radiation beam such that the meniscus moves along the surface of the damper in response to the movement of the substrate.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which:

FIGS. 2a, 2b, 2c and 2d each depict, in cross section, two different versions of a fluid handling system with different features illustrated on the left hand side and the right hand side of each version, which may extend around the complete circumference;

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
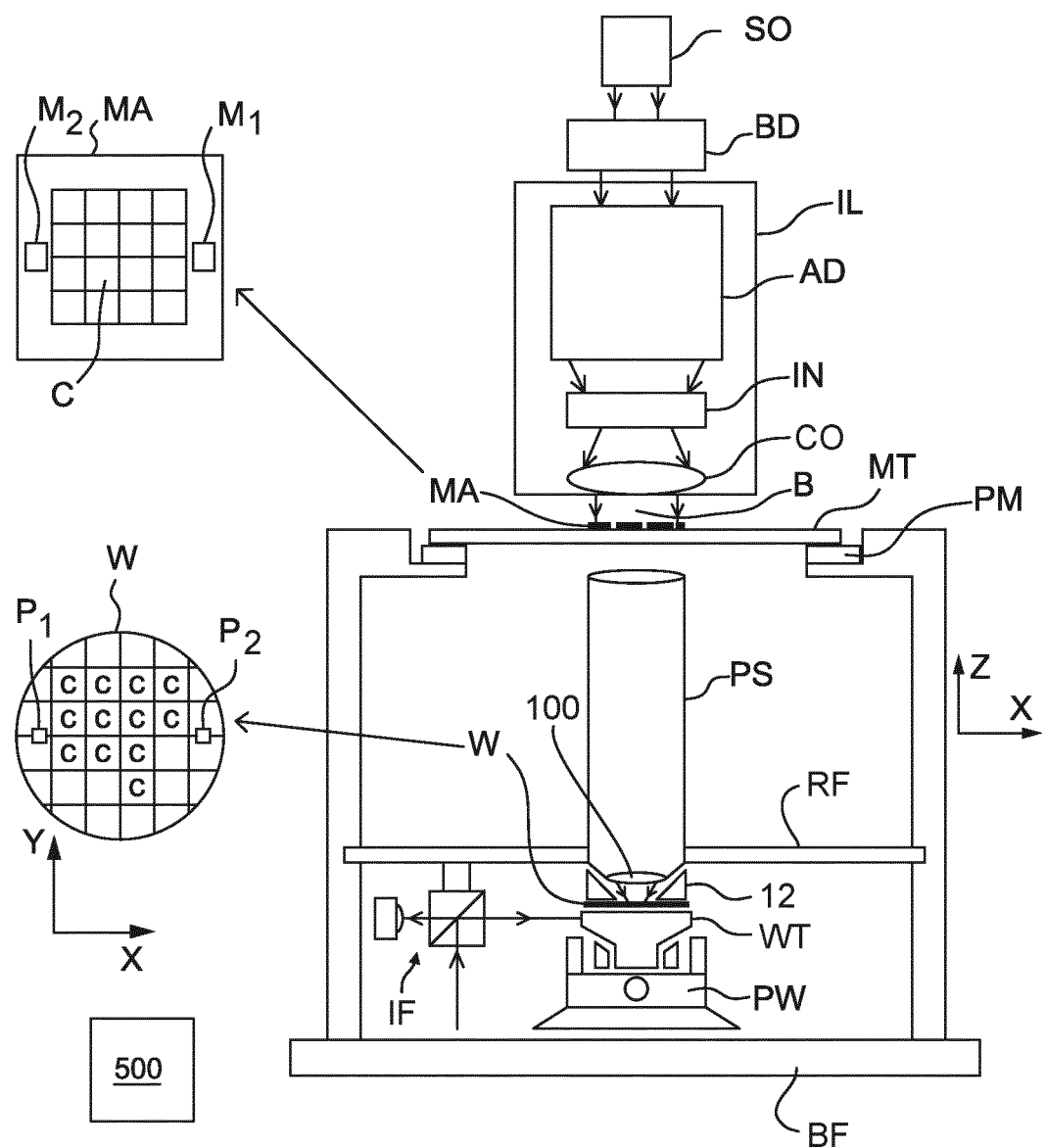
FIG. 1 depicts the schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. A controller 500 controls the overall operation of the apparatus. Controller 500 may be a centralised control system or a system of multiple separate sub-controllers within various sub-systems of the lithographic apparatus.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

FIGS. 2a, 2b, 2c and 2d show different features which may be present in variations of a fluid handling system. The designs may share some of the same features as FIGS. 2a, 2b, 2c and 2d unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2a, or the right hand side of FIG. 2a, or the left hand side of FIG. 2b, or the right hand side of FIG. 2b, or the left hand side of 2c, or the right hand side of 2c, or the left hand side of 2d, or the right hand side of 2d. Alternatively, the fluid handling system may be provided with any combination of features from these figures at different locations around the circumference. The fluid handling system may comprise the fluid handling structure 12 as described in the variations below.

Figure 2A:
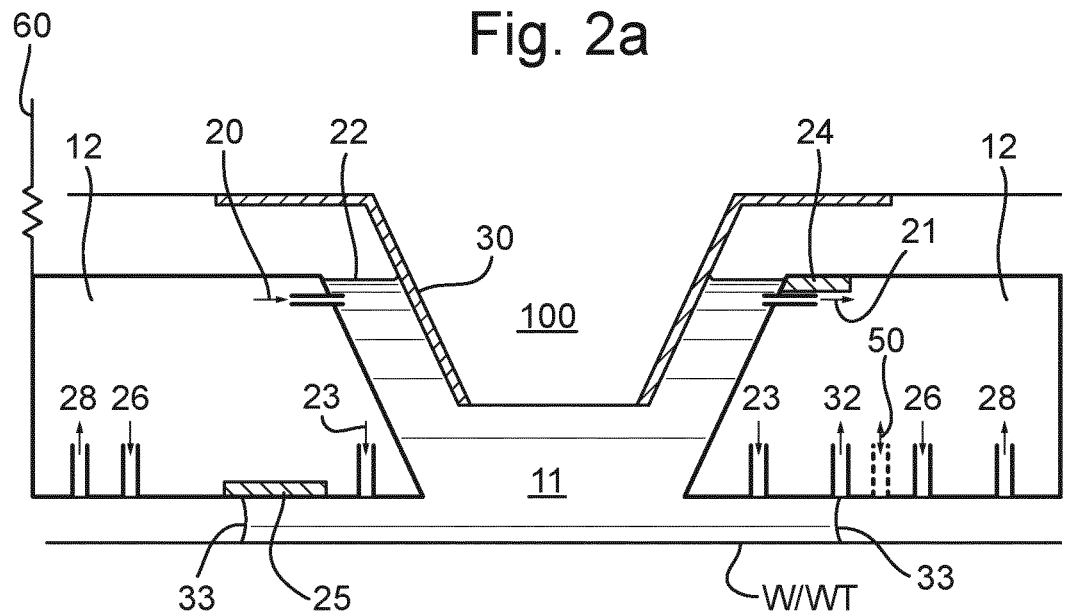

FIG. 2a shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an underpressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2a. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26.

The two different versions of the fluid handling structure 12 of the left and right sides of FIG. 2a pin the meniscus 33. The version of the fluid handling structure 12 on the right hand side of FIG. 2a may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets. Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

The left hand side of the fluid handling system in FIG. 2a may comprise a spring 60. The spring 60 may be an adjustable passive spring configured to apply a biasing force to the fluid handling structure 12 in the direction of the substrate W. Thus, the spring 60 can be used to control the height of the fluid handling structure 12 above the substrate W. Such adjustable passive springs are described in U.S. Pat. No. 7,199,874 which is herein incorporated by reference in its entirety. Other bias devices may also be appropriate, for example, using an electromagnetic force. Although the spring 60 is shown with the left hand side of FIG. 2a, it is optional and does not need to be included with the other features of the left hand side of FIG. 2a. The spring 60 is not shown on any of the other figures, but could also be included with the other variations of the fluid handling system described in relation to FIG. 2a, 2b, 2c, or 2d.

Figure 2B:
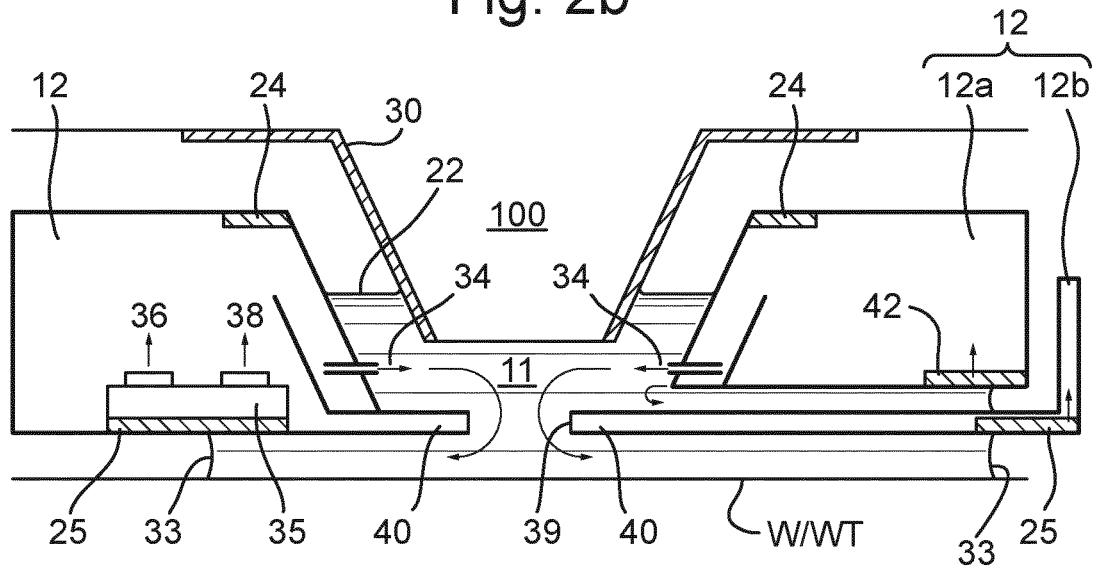

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, mainly in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween.

Figure 2C:
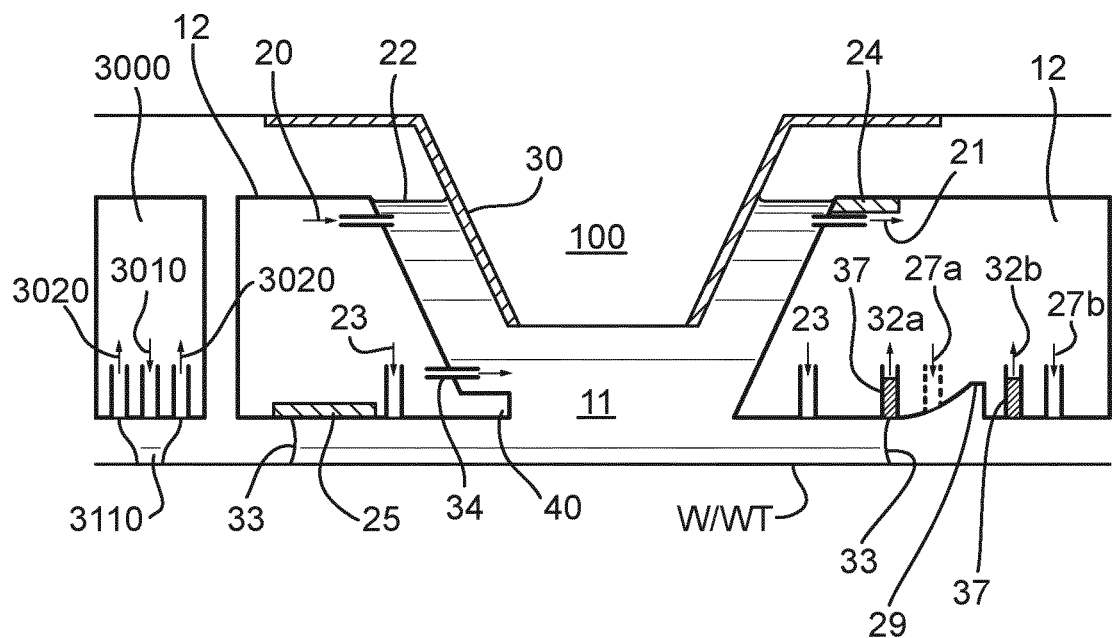

FIG. 2c shows two different versions of the fluid handling structure 12 on its left side and on its right side, which may be used to pin the meniscus 33 of the immersion liquid to the fluid handling structure 12 as described above in relation to FIGS. 2a and/or 2b. Features shown in FIG. 2c which are common to FIGS. 2a and/or 2b share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2c pin the meniscus 33. The version of the fluid handling structure 12 on the right hand side of FIG. 2c may pin the meniscus 33 at a position that is substantially fixed with respect to the final element 100, due to the fixed position of the recovery opening 32a. The version of the fluid handling structure 12 on the left hand side of FIG. 2c may pin the meniscus 33 below the recovery opening 25, and thus the meniscus 33 may move along the length and/or width of the recovery opening 25.

As described above in relation to FIG. 2b, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2c, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2c, a fluid handling system may comprise the fluid handling structure 12 as described above and a further device 3000. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2a, the right hand side of FIG. 2a, the left hand side of FIG. 2b, the right hand side of FIG. 2b or (as described below) the right hand side of FIG. 2c, in combination with the further device 3000.

The further device 3000 may otherwise be referred to as a droplet catcher. The further device 3000 is provided to reduce occurrence of liquid on the surface of the substrate W after the fluid handling structure 12 has moved over the surface. The further device 3000 may comprise a liquid supply member 3010 and at least one extraction member 3020. The at least one extraction member 3020 may be formed in a shape surrounding the at least one supply member 3010 in plan. The at least one liquid supply member 3010 may be configured to provide a further liquid to a space 3110 between at least a part of the further device 3000 and the surface of the substrate W. The further device 3000 may be configured to recover at least some of the liquid via the at least one extraction member 3020. The further device 3000 may be used to incorporate any liquid left on the surface of the substrate W with the liquid in the space 3110 and then use the further device 3000 to extract the liquid such that the amount of liquid remaining on the surface of the substrate W is reduced.

The further device 3000 is shown as a separate device from the fluid handling structure 12 in FIG. 2c. The further device 3000 may be positioned adjacent to the fluid handling structure 12. Alternatively, the further device 3000 may be part of, i.e. integral to, the fluid handling structure 12 (as in FIG. 3d, however, either arrangement can be selected).

The further device 3000 may be configured to provide a liquid to the space 3110 which is separate from the liquid provided by the fluid handling structure 12.

Additionally or alternatively, the fluid handling structure 12 may have the components as shown on the right hand side of FIG. 2c. More specifically, the fluid handling structure 12 may comprise the at least one liquid supply member, two extraction members (e.g., recovery openings 32a and 32b) and two gas supply members (e.g., gas supply openings 27a and 27b) formed on the surface of the fluid handling structure 12. Gas supply opening 27a can be omitted, i.e. is optional. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2b. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor. The porous material 37 does not need to be flush with the bottom surface of the fluid handling structure 12.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2a, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32a) and the first gas supply member (e.g., gas supply opening 27a) as described in the arrangement above. Alternatively or additionally, the further opening may be arranged between the second extraction member (e.g., recovery opening 32b) and the second gas supply member (e.g., gas supply opening 27b) as described in the arrangement above. The further opening may be the same as further opening 50 described above.

Optionally, the fluid handling structure 12 comprises a recess 29. The recess 29 may be provided between the recovery opening 32a and recovery opening 32b or gas supply opening 27a and recovery opening 32b. The shape of the recess 29 may be uniform around the fluid handling structure 12 and may optionally contain an inclined surface. In the case of the recess 29 provided between the recovery opening 32a and recovery opening 32b, the gas supply opening 27b may be provided on the inclined surface as shown in FIG. 2c. In the case of the recess 29 provided between the supply opening 27a and recovery opening 32b, the gas supply opening 27b may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12.

FIG. 2d shows, in its left and right halves, two different versions of the fluid handling structure 12. The fluid handling structure 12 of the left half of FIG. 2d has a liquid injection buffer 41a, which holds a buffer amount of immersion liquid, and liquid injection holes 41 which supply immersion liquid from the liquid injection buffer to the space 11. Outwardly of the liquid injection holes 41 are inner liquid recovery apertures 43 for conducting liquid to an inner recovery buffer 43a which is provided with a porous member. A recess 29 similar to that described relating to FIG. 2c is provided outward of the inner liquid recovery apertures 43. Outward of the recess 29, in the lower face of the fluid handling structure 12 is a gas guiding groove 44 into which open outer recovery holes 44a. The outer recovery holes 44a lead a two-phase recovery flow to outer recovery buffer 44b which is also provided with a porous member. Outermost are gas sealing holes 45 which communicate between a gas sealing buffer volume 45a and the space underneath the fluid handling structure 12 to provide a gas flow to contain the immersion liquid.

The fluid handling structure 12 of the right half of FIG. 2d has a liquid supply opening 20 in the inner inclined face thereof. In the underside of the fluid handling structure 12 there are (from inner side to outer side) an extraction opening 25 provided with a porous member 37; a first gas knife opening 26a, a second gas knife opening 26b and a third gas knife opening 26c. Each of these openings opens into a groove in the underside of the fluid handling structure 12 that provides a buffer volume. The outermost part of the fluid handling structure 12 is stepped so as to provide a greater separation between the fluid handling structure 12 and the substrate W.

FIGS. 2a-2d show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32a, recovery opening 32b and/or the intermediate recovery 42. Examples of the supply member referred to above include supply opening 20, under supply opening 23, gas knife opening 26, gas supply opening 27a, gas supply opening 27b, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an underpressure which draws the fluid, liquid or gas into the extraction member. The supply member may supply fluid, liquid or gas to the space by being connected to a relevant supply.

As previously described, although use of immersion fluid/liquid is beneficial for improving resolution of smaller features on a substrate, there are also issues with the use of immersion fluid/liquid relating to defects being introduced on the substrate.

In general, when immersion liquid is used, droplets of the immersion liquid may be left behind on the surface of the substrate W. The meniscus 33 at the edge of the immersion liquid may collide with any droplets on the surface of the substrate W. When a droplet hits the meniscus 33, gas may be entrapped within the immersion liquid. This results in a bubble in the immersion liquid. Formation of bubbles in the immersion liquid can lead to defects on the substrate W. Droplets that remain on the surface of the substrate W may cause drying spots and/or affect the chemical properties of the resist, also leading to defects.

It is known that the incidence of droplets increases with speed of movement of the substrate W relative to the fluid handling system. In some cases there is no or negligible droplet formation below a critical scan speed and significant droplet formation above the critical scan speed. The critical scan speed is related to the static receding contact angle between the immersion liquid and the resist provided on the substrate W. Increasing the static receding contact angle increases the critical scan speed. Since the critical scan speed may be a limiting factor on throughput of the lithographic apparatus it is desirable to increase the critical scan speed. Efforts to increase the critical scan speed have included increasing the static receding contact angle by changing the formulation of the resists or by providing a top coat above the resist. However, further improvements are desirable.

The present invention may help reduce the effects of at least one droplet related issue. The present invention includes various embodiments of a droplet mitigation system which may be used in all types of localised immersion lithography apparatus.

As described in detail below, embodiments provide a fluid handling system in which a meniscus of the fluid moves in response to relative movement of the substrate and the fluid handling system. Advantageously, this increases the maximum tolerable speed of relative movement between the fluid handling system and the substrate without substantial droplet formation occurring.

Figure 3A:
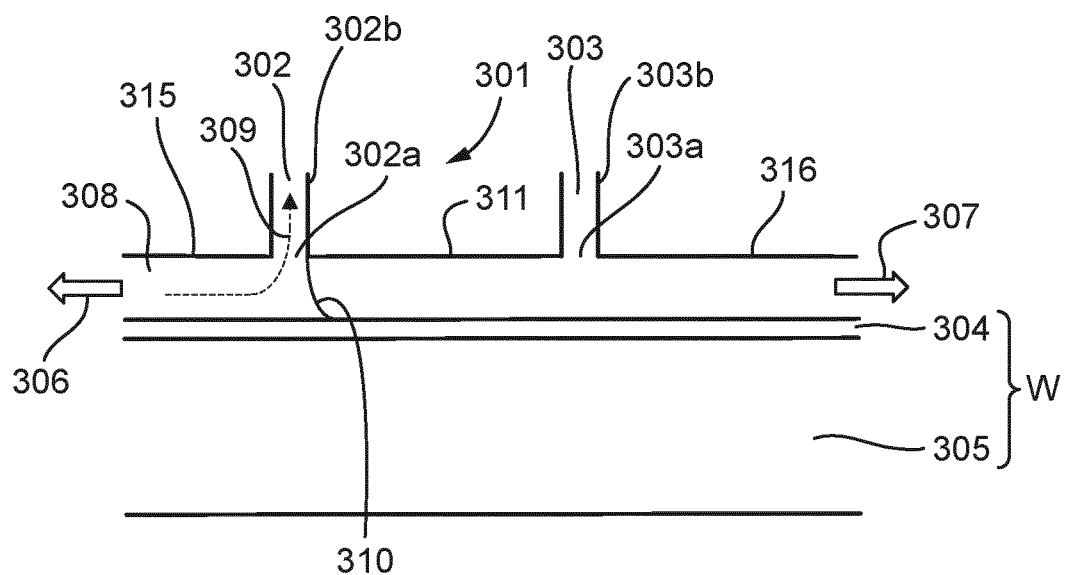
FIGS. 3a and 3b show a fluid handling system according to a first embodiment in respective first and second operating states.
Figure 3B:
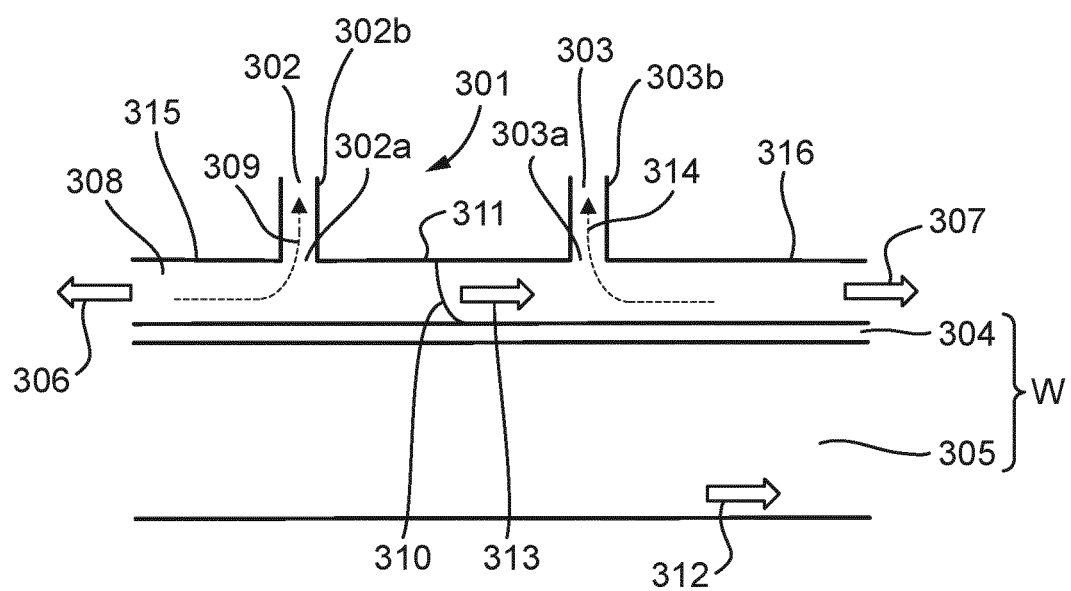

FIGS. 3a and 3b show part of a fluid handling system 301 according to a first embodiment. The fluid handling system 301 may confine immersion liquid to a liquid confinement space between a part of a projection system PS and a surface of a substrate W. The immersion liquid may be any of the above-described immersion fluids. For example, the immersion liquid may be water. A radiation beam B projected from the projection system PS may irradiate the surface of the substrate W through the immersion liquid.

FIG. 3a shows only a part of the fluid handling system 301 that supports the meniscus 310 of the immersion liquid. The meniscus 310 forms the boundary between the immersion liquid and the surrounding environment of the fluid handling system 301. Although not shown in FIG. 3a, a main part of the fluid handling system 301 is located in the direction indicated by the arrow 306. The main part of the fluid handling system 301 may comprise immersion liquid and may comprise any parts of the various structures disclosed above with reference to FIGS. 2a to 2d, or indeed any other system that localises immersion liquid beneath the projection system PS. In particular, the main part of the fluid handling system 301 may comprise a lens bath, such as the lens bath 11 as described with reference to FIGS. 2a to 2d.

As shown in FIG. 3a, the fluid handling system 301 is arranged above a substrate W. The substrate W may comprise a wafer 305 and a resist coating 304 on the wafer 305. There is a channel 308 between the fluid handling system 301 and the substrate W. The part of the channel 308 between the main part of the fluid handling system 301, that is located in direction 306, and the meniscus 310 may comprise immersion liquid. The part of the channel 308 between the meniscus 310 and the external environment of the fluid handling system 301, that is located in direction 307, may comprise gas.

The fluid handling system 301 comprises a first extraction member 302. The first extraction member 302 comprises a first extraction conduit 302b. The first extraction conduit 302b is a conduit of fluid and may provide a flow of immersion liquid out of the fluid handling system 301. The first extraction member 302 also comprises an first extraction opening 302a arranged in an upper surface of the channel 308. The first extraction opening 302a is an end of the first extraction conduit 302b.

The fluid handling system 301 comprises a second extraction member 303. The second extraction member 303 comprises a second extraction conduit 303b. The second extraction conduit 303b is a conduit of fluid, such as a gas. The second extraction member 303 also comprises an second extraction opening 303a arranged in an upper surface of the channel 308. The second extraction opening 303a is an end of the second extraction conduit 303b.

There is an upper surface of the channel 308 between the first extraction member 302 and the second extraction member 303 that is referred to herein as a damper 311. The length of the damper 311 defines the separation of the first extraction member 302 and the second extraction member 303 along the length of the channel 308.

The first extraction member 302 may be configured to extract immersion liquid by a fluid flow 309. The only fluid flow through the first extraction member 302 may substantially be the fluid flow 309 of immersion liquid. However, the first extraction member 302 may also extract some gas from the external environment of the fluid handling system 301. The fluid flow through the first extraction member 302 may therefore be a two-phase flow.

The second extraction member 303 may be configured to extract gas from the channel 308. FIG. 3b shows a gas flow 314 of the gas extraction. The gas flow 314 may create an underpressure in the channel 308.

Although not shown in FIGS. 3a and 3b, a main part of the fluid handling system 301, that is located in direction 306, may comprise a fluid handling structure with an inner surface configured to confine the immersion liquid. The first extraction member 302 and the second extraction member 303 are located radially away from the main part of the fluid handling system 301. The second extraction member 303 may be located further away from the inner surface of the fluid handling structure than the first extraction member 302. Alternatively, the first extraction member 302 and the second extraction member 303 may be part of the main part of the fluid handling system 301. The second extraction member 303 may be located further away from a mid-point of the fluid handling system 301 than the first extraction member 302.

A first operating state of the fluid handling system 301 is shown in FIG. 3a. In the first operating state, there may be no relative movement between the substrate W and the fluid handling system 301. The first extraction member 302 may be configured so that, when in the first operating state, the amount of extracted immersion liquid through it is substantially no more than that required to maintain the meniscus 310 at the substantially the same location along the channel 308. The fluid flow rate through the first extraction member 302 is substantially the minimum flow rate capable of holding the meniscus 310 stationary when there is no relative movement between the substrate W and the fluid handling system 301.

A second operating state of the fluid handling system is shown in FIG. 3b. In the second operating state, the substrate W may move relative to the fluid handling system 301. The second operating state includes scanning movements in a scan direction. The scan direction may be substantially perpendicular to the direction of propagation of the radiation beam B. The scan direction may be direction 312 as shown in FIG. 3b. It should be noted that the second operating state may also include other relative movements between the substrate W and the fluid handling system 301 than scanning movements. For example, the second operating state may include preparatory movements prior to a scanning movement.

The first extraction member 302 may be configured so that the amount of immersion liquid extracted through it is substantially the same in both the first and second operating states. The movement of the substrate W in direction 312 generates shear forces on the immersion liquid in the channel 308. The meniscus 310 therefore moves along the channel 308 in direction 313. The increased flow of immersion liquid into the channel 308 may be referred to as a couette flow, and also referred to as a shear driven flow or a pressure driven flow. The generation of the underpressure in the channel 308 by the gas flow 314 also supports the movement of the meniscus 310 along the channel 308.

In the second operating state, the meniscus 310 is not held stationary by the fluid flow through the first extraction member 302. The fluid flow through the first extraction member 302 is only sufficient to maintain the meniscus 310 stationary when there is no relative movement between the fluid handling system 301 and the substrate W. Accordingly, in the second operating state, the meniscus 310 moves along the channel 308. Advantageously, the maximum tolerable speed of relative movement between the fluid handling system 301 and the substrate W is increased. The speed of relative movement between the meniscus 310 and the substrate W may be below, or at, the critical scan speed so that significant droplet formation does not occur. The relative speed of movement between the fluid handling system 301 and the meniscus 310 increases the relative speed of movement between the fluid handling system 301 and the substrate W. The relative speed of movement between the fluid handling system 301 and the substrate W may be up to twice that of the critical scan speed of known systems in which the meniscus 310 is substantially stationary within the channel 308.

The distance that the meniscus 310 may move along the channel 308 is dependent on the length of the surface of the damper 311 between the first extraction member 302 and the second extraction member 303. The length of the surface of the damper 311 between the first extraction member 302 and the second extraction member 303 may be between about 1 mm and about 100 mm, is preferably between about 1 mm and about 50 mm, is preferably longer than about 20 mm, is preferably about 30 mm and more preferably longer than about 30 mm.

The damper 311 may be configured so that its surface properties support the appropriate movement of an end of the meniscus 310 along it. In particular, the surface of the damper 311 may be coated, or otherwise configured, so that it is any of hydrophobic, hydrophilic or porous.

The surface of damper 311 may be configured so that it is substantially parallel to the surface of the substrate W.

Alternatively, the surface of damper 311 may be curved or slanted away from the surface of the substrate W. That is to say, a first end of the surface of damper 311 is at the first extraction member 302 and a second end of the surface of damper 311 is at the second extraction member 303. The surface of the damper 311 may be configured so that the separation between the surface of the damper 311 and the surface of the substrate W is greater at the second end than at the first end.

The above described damper 311 may be referred to as a first damper 311. As shown in at least FIGS. 3a and 3b, the fluid handling system 301 may comprise a second damper 315. A surface of the second damper 315 is a length of the upper surface of the channel 308 on the other side of the first extraction member 302 to the first damper 311. The second damper 315 may be configured so that the immersion liquid is supported between a surface of the second damper 315 and the surface of the substrate W.

The surface of the second damper 315 may be parallel to the surface of the substrate W. The separation between the surface of the second damper 315 and the surface of the substrate W may be the same as the separation between all, or at least part of, the surface of the first damper 311 and the surface of the substrate W. Alternatively, or in addition, the separation between all, or at least part of, the surface of the first damper 311 and the surface of the substrate W may be greater that the separation between at least part of the surface of the second damper 315 and the surface of the substrate W.

Figure 4:
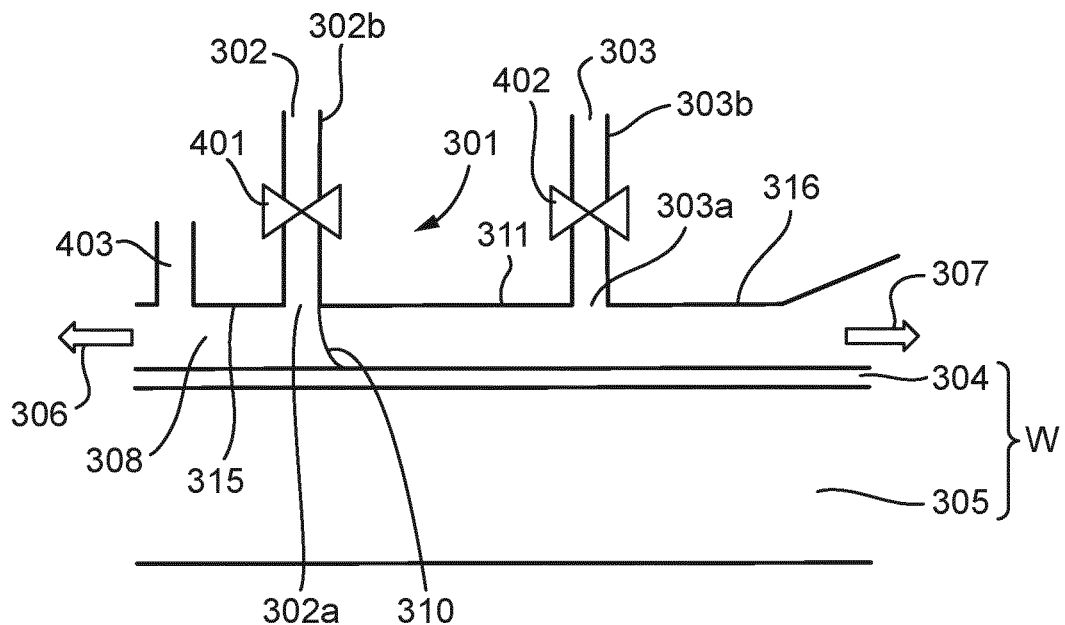
FIG. 4 shows a fluid handling system according to a second embodiment.

A second embodiment is shown in FIG. 4. The fluid handling system 301 of the second embodiment may comprise all of the above-described features of the fluid handling system 301 of the first embodiment. The fluid handling system 301 of the second embodiment may differ from the fluid handling system 301 of the first embodiment by further comprising first valve 401 and a second valve 402.

The first valve 401 may be arranged to control the flow of fluid through the first extraction member 302. The first valve 401 may be arranged on the first extraction conduit 302b of the first extraction member 302.

The second valve 402 may be arranged to control the flow of fluid through the second extraction member 303. The second valve 402 may be arranged on the second extraction conduit 303b of the second extraction member 303.

Advantageously, the first valve 401 and second valve 402 allow improved control of the fluid flows and pressures within the channel 308. This allows improved control of the movement of the meniscus 310 along the channel 308.

FIG. 4 also shows further features of the fluid handling system 301 that may be present in any of the embodiments of a fluid handling system 301 disclosed herein.

For example, the fluid handling system 301 may further comprise a fluid supply opening 403. The fluid supply opening 403 may be an opening in the upper surface of the channel 308. The fluid supply opening 403 may be separated from the first extraction member 302 by a length of the upper surface of the channel 308. As described earlier, this may be surface of a second damper 315. The fluid supply opening 403 may be a supply of immersion liquid into the channel 308. The supply of immersion liquid to the channel 308 may create an overpressure of immersion liquid in the channel 308. Although not shown in FIGS. 3a and 3b, the embodiment shown therein may also comprise fluid supply opening 403. Embodiments also include the use of a valve on the fluid supply opening 403 to improve the control of the fluid flows and pressures within the channel 308.

Also shown in FIG. 4 is a length of the upper surface 316 of the channel 308 that starts at the second extraction member 303 and extends in direction 307 to the external environment of the fluid handling system 301. As shown in FIG. 4, the part of the upper surface 316 of the channel 308 that is adjacent the second extraction member 303 may be parallel to the surface of the substrate W. Another part of the upper surface 316 of the channel 308, that is further from the second extraction member 303, may be slanted/curved so that the separation between the upper surface 316 of the channel 308 and the surface of the substrate W changes. As shown in FIG. 4, the separation between the upper surface 316 of the channel 308 and the surface of the substrate W may increase. However, embodiments also include the separation between the upper surface 316 of the channel 308 and the surface of the substrate W locally decreasing, and the separation may then increase. The pressure of the gas in the channel 308 may be dependent of the shape of the upper surface 316. The shape of the surface 316 may be determined so as to generate an appropriate pressure of the gas in the channel 308 for supporting movement of the meniscus 310 under the intended operating conditions.

Figure 5:
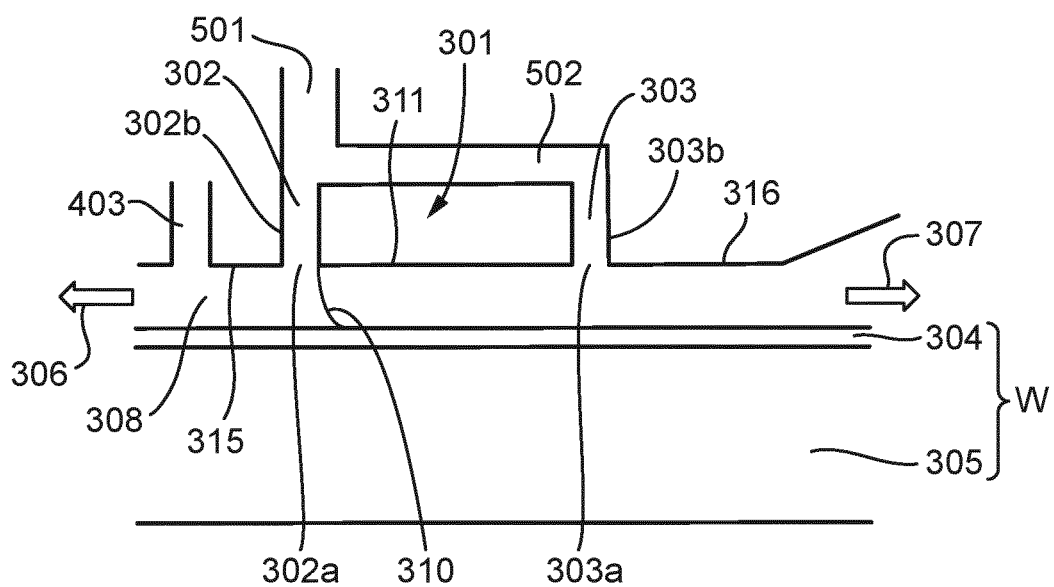
FIG. 5 shows a fluid handling system according to a third embodiment.

A third embodiment is shown in FIG. 5. The fluid handling system 301 of the third embodiment may comprise some, or all, of the above described features of the fluid handling system 301 of the first and second embodiments.

The fluid handling system 301 of the third embodiment may differ from the fluid handling system 301 of the first and second embodiments by further comprising a third extraction conduit 501. The third extraction conduit 501 may be in fluid communication with both the first extraction conduit 302b and the second extraction conduit 303b. There may be a connecting conduit 502 between the second extraction conduit 303b and the third extraction conduit 501. The connecting conduit 502 may be part of the second extraction conduit 303b. The flow of fluid through the third extraction conduit 501 may comprise both immersion liquid and gas and thereby be a two-phase flow.

In a first implementation of the third embodiment, there may be no valves on the first extraction conduit 302b, the second extraction conduit 303b and the third extraction conduit 501. The shapes/geometries of the first extraction conduit 302b, the second extraction conduit 303b and/or the third extraction conduit 501 are arranged so that the, under the intended operation conditions, the gas and/or immersion liquid pressures are appropriate for providing movement of the meniscus 310 along the channel 308. Advantageously, the pressures inherently generated within the channel 308 are appropriate for passively supporting the meniscus 310 movement.

In a second implementation of the third embodiment, there may be a valve on the third extraction conduit 501 but no valves on the first extraction conduit 302b and the second extraction conduit 303b. As described for the first implementation, the shapes/geometries of the first extraction conduit 302b and the second extraction conduit 303b may be arranged to inherently generate appropriate pressures for supporting the meniscus 310 movement along the channel 308. The valve on the third extraction conduit 501 may be used to control the fluid flow through the third extraction conduit 501. This may improve the control of the meniscus 310 movement.

In a third implementation of the third embodiment, there may be valves on any, or all, of the first extraction conduit 302b, the second extraction conduit 303b and third extraction conduit 501. The valves on the first extraction conduit 302b and the second extraction conduit 303b may be as described for the second embodiment and shown in FIG. 4. Advantageously, the valves may improve the control of the meniscus 310 movement.

Figure 6:
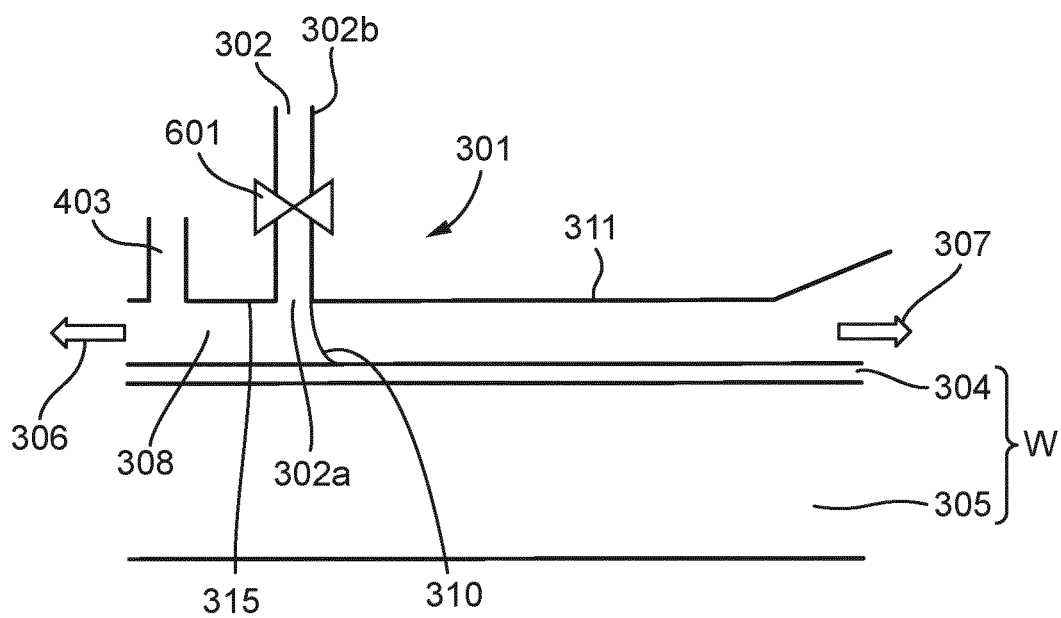
FIG. 6 shows a fluid handling system according to a fourth embodiment.

A fourth embodiment is shown in FIG. 6. The fluid handling system 301 of the fourth embodiment may comprise some of the above described features of the fluid handling system 301 of the first, second and third embodiments.

The fourth embodiment may differ from the first, second and third embodiments by comprising the first extraction member 302 but not comprising the second extraction member 303.

In the fourth embodiment, the movement of the meniscus 310 along the channel 308 may be passively supported by the inherent pressures generated in the channel 308 during operation. For example, surface tension may cause an underpressure in the channel 308 that supports the movement of the meniscus 310 along the channel 308.

There may be a valve 601 on the first extraction conduit 302b for controlling the fluid flow through the first extraction member 302. The valve 601 improves the control of the fluid flows and/or pressures within the channel 308 and thereby improves the control of the movement of the meniscus 310.

The above-described embodiments provide a number of designs of fluid handling system 301 in which a meniscus 310 may move along a channel 308. An end of the meniscus 310 moves along the surface of the damper 311 and the other end of the meniscus 310 moves along the surface of the substrate W.

In known systems, a meniscus of immersion liquid is held stationary relative to the fluid handling system. The fluid flow through a pinning opening in the channel 308 between the fluid handling system and the substrate holds the meniscus to the opening when there is relative movement between the fluid handling system and the substrate. In known systems, the meniscus is therefore held stationary between an opening and the substrate. The meniscus is not moveably supported between a damper and the substrate.

An important difference between embodiments and known systems is that, in embodiments, the fluid flow through the first extraction member 302 is less than that in known systems. Under all operating conditions, the fluid flow through the first extraction member 302 is substantially no more than that required to hold the meniscus 310 stationary when there is no relative movement between the fluid handling system 301 and the substrate W. The meniscus 310 therefore moves along the channel 308 when there is relative movement between the fluid handling system 301 and the substrate W. The meniscus 310 may therefore be supported between the damper 311 and the substrate W.

In the above described embodiments, only a single first extraction member 302 is described. However, embodiments include there being a plurality of first extraction members 302. The plurality of first extraction members 302 may be arranged around a mid-point of the fluid handling system 301. The plurality of first extraction members 302 may be arranged in any configuration. For example, they may be in a circular, square, rectangular or star shaped configuration.

The first extraction opening 302a of each first extraction member 302 may have any shape. For example, each first extraction opening 302a may be circular, square, rectangular or slot shaped.

In the above described embodiments, only a single second extraction member 303 is described. However, embodiments include there being a plurality of second extraction members 303. The plurality of second extraction members 303 may be arranged around a mid-point of the fluid handling system 301. For example, they may be in a circular, square, rectangular or star shaped configuration. The configuration of the second extraction members 303 may the same as, or different from, the configuration of the first extraction members 302.

The second extraction opening 303a of each second extraction member 303 may have any shape. For example, each second extraction opening 303a may be circular, square, rectangular or slot shaped.

Although not shown in FIGS. 3a to 6, embodiments also include the fluid handling system 301 comprising a number of sensors for measuring the conditions in the channel 308, or any of the conduits. For example, the fluid handling system 301 may comprise any of temperature, pressure or other types of sensor. The fluid handling system 301 may be controlled in dependence on measurements by the sensors. For example, any of the valves may be operated in dependence the measured pressures. The speed at which the substrate W is moved relative to the fluid handling system 301 may also be controlled in dependence on the sensor measurements.

Embodiments may be incorporated into any of the fluid handling systems shown in FIGS. 2a to 2d. For example, in FIG. 2a, the pinning opening 32 may alternatively be operated as the first extraction member 302 of embodiments. The further opening 50 may alternatively be operated as the second extraction member 303 of embodiments. The separation between the pinning opening 32 and the further opening 50 may also be increased to provide an appropriate distance for the meniscus 310 to move along. Similarly, in FIG. 2c, the recovery opening 32a may alternatively be operated as the first extraction member 302 of embodiments. The recovery opening 32b may alternatively be operated as the second extraction member 303 of embodiments. The separation between the recovery opening 32a and the recovery opening 32b may also be increased to provide an appropriate distance for the meniscus 310 to move along.

Embodiments include the presence and use of further features from those specifically described above. In particular, the fluid handling system 301 of embodiments may include one or more pumps for controlling the fluid flows through the first extraction member 302 and the second extraction member 303. One or pumps for controlling the fluid flows through the first extraction member 302 and the second extraction member 303 may additionally, or alternatively, be external to the fluid handling system 301.

Embodiments also include a number of modifications and variations to the above described techniques.

For example, in an alternative implementation of the second embodiment, there may be a valve on only one of the first extraction conduit 302b and the second extraction conduit 303b.

In an alternative implementation of embodiments, variable pumps may be used instead of one or more of the valves.

Embodiments include each first extraction member 302 and/or second extraction member 303 comprising a porous material and/or a sieve.

In the above described embodiments, the first extraction opening 302a, the second extraction opening 303a and the surface of the damper 311 are described as being in an upper surface of the channel 308. The surface will be an upper surface of the channel 308 in the typical configuration of the substrate W being arranged horizontally. However, embodiments more generally include the first extraction opening 302a, the second extraction opening 303a and the surface of the damper 311 being arranged in a surface of the fluid handling system 301 that is substantially parallel to the surface of the substrate W. The surface of the substrate W is not restricted to being arranged horizontally.

The present invention may provide a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate support WT, etc.

Specifically, the lithographic apparatus may comprise the projection system PS configured to project the radiation beam B towards the region of the surface of a substrate W. The lithographic apparatus may further comprise the fluid handling system 301 as described in any of the above embodiments and variations.

The lithographic apparatus may comprise an actuator configured to move the substrate W relative to the fluid handling system 301. Thus, the actuator may be used to control the position of the substrate W (or alternatively, the position of the fluid handling system 301). The actuator could be, or could comprise, the substrate support (e.g., a substrate table) WT and/or a substrate holder constructed to hold the substrate W and/or the second positioner PW configured to accurately position the substrate support WT.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

Embodiments include the following numbered clauses:

1. A fluid handling system for a lithographic apparatus, wherein the fluid handling system is configured to confine immersion liquid to a liquid confinement space between a part of a projection system and a surface of a substrate in the lithographic apparatus whereby a radiation beam projected from the projection system can irradiate the surface of the substrate by passing through the immersion liquid, the fluid handling system comprising: a damper arranged between a first extraction member and a second extraction member both configured to extract fluid; wherein the damper is configured to support a meniscus of the immersion liquid between a surface of the damper and the surface of the substrate.
2. The fluid handling system according to clause 1, further comprising a first valve configured to control the flow of fluid through the first extraction member.
3. The fluid handling system according to clause 1 or 2, further comprising a second valve configured to control the flow of fluid through the second extraction member.
4. The fluid handling system according to any preceding clause, wherein the first extraction member is configured so that, in use, the fluid that flows through it substantially comprises immersion liquid.
5. The fluid handling system according to any preceding clause, wherein the second extraction member is configured so that, in use, the fluid flow through it substantially consists of gas.
6. The fluid handling system according to any preceding clause, wherein: the first extraction member comprises a first extraction conduit and a first extraction opening, wherein the first extraction conduit is configured to receive fluid extracted through the first extraction opening; and the second extraction member comprises a second extraction conduit and a second extraction opening, wherein the second extraction conduit is configured to receive fluid extracted through the second extraction opening.
7. The fluid handling system according to clause 6, further comprising a third extraction conduit configured to receive the fluid from both the first extraction conduit and the second extraction conduit.

8. The fluid handling system according to clause 7, further comprising a third valve configured to control the flow of fluid through the third extraction conduit.

9. The fluid handling system according to any preceding clause, wherein the first extraction member is configured so that, in use, the fluid flow rate through it is substantially constant.

10. The fluid handling system according to any preceding clause, wherein the first extraction member is arranged so that, in use, the fluid flow rate through it is substantially the minimum flow rate capable of holding the meniscus stationary when there is no relative movement between the substrate and the fluid handling system.

11. The fluid handling system according to any preceding clause, wherein the damper, the first extraction member and/or the second extraction member are configured so that, in use, the meniscus moves along the surface of the damper in response to movement of the substrate relative to the fluid handling system.

12. The fluid handling system according to any preceding clause, wherein the length of the damper surface between the first extraction member and the second extraction member is between 1 mm and 100 mm, is preferably between 1 mm and 50 mm, and is preferably longer than 20 mm.

13. The fluid handling system according to any preceding clause, wherein the surface of damper is configured so that it is substantially parallel to the surface of the substrate.

14. The fluid handling system according to any of clauses 1 to 12, wherein: a first end of the surface of damper is at the first extraction member; a second end of the surface of damper is at the second extraction member; and the surface of the damper is configured so that the separation between the surface of the damper and the surface of the substrate is larger, or smaller, at the second end that the first end.

15. The fluid handling system according to clause 14, wherein the surface of the damper is curved, slanted or wave shaped.

16. The fluid handling system according to any preceding clause, wherein: the damper is a first damper; and the apparatus further comprises a second damper arranged on the other side of the first extraction member than the first damper and configured so that the immersion liquid is supported between a surface of the second damper and the surface of the substrate; wherein the separation between at least part of the surface of the first damper and the surface of the substrate is greater that the separation between at least part of the surface of the second damper and the surface of the substrate.

17. The fluid handling system according to any preceding clause, wherein: the fluid handling system comprises a fluid handling structure with an inner surface configured to confine the immersion liquid; the first and second extraction members are located radially away from the inner surface of the fluid handling structure; and the second extraction member is located further away from the inner surface of the fluid handling structure than the first extraction member.

18. The fluid handling system according to any preceding clause, wherein there are a plurality of first extraction members.

19. The fluid handling system according to clause 18, wherein the plurality of first extraction members are arranged around a mid-point of the liquid confinement space; and the plurality of first extraction members are optionally arranged in any of a circular, square, rectangular or star configuration, or any combination thereof.

20. The fluid handling system according to any preceding clause, wherein there are a plurality of second extraction members.

21. The fluid handling system according to clause 20, wherein the plurality of second extraction members are arranged around a mid-point of the liquid confinement space; and the plurality of second extraction members are optionally arranged in any of a circular, square, rectangular or star configuration, or any combination thereof.

22. A lithographic apparatus comprising the fluid handling system of any preceding clause.

23. The apparatus according to clause 22, further comprising a positioning system configured to move a substrate holder configured to support the substrate relative to the projection system in a plane substantially parallel to the surface of the substrate.

24. A device manufacturing method in a lithographic apparatus having a substrate holder configured to hold a substrate, a projection system configure to project a radiation beam onto the substrate held by the substrate holder, and a fluid handling system according to any of clauses 1 to 21, the method comprising: using the fluid handling system to confine immersion liquid to the space between at least a part of the fluid handling system and the surface of the substrate; projecting a patterned beam of radiation onto the substrate through the immersion liquid in the space; supporting a meniscus of the immersion liquid between a surface of a damper and the substrate; and moving the substrate in a scan direction substantially perpendicular to the direction of propagation of the radiation beam such that the meniscus moves along the surface of the damper in response to the movement of the substrate.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid handling system for a lithographic apparatus, wherein the fluid handling system is configured to confine immersion liquid to a liquid confinement space between a part of a projection system and a surface of a substrate in the lithographic apparatus wherein a radiation beam projected from the projection system can irradiate the surface of the substrate by passing through the immersion liquid, the fluid handling system comprising:
 a damper arranged between and adjacent a first extraction member and a second extraction member both configured to extract fluid,
 wherein the damper is configured to support a meniscus of the immersion liquid between a surface of the damper and the surface of the substrate and between the first and second extraction members during motions between the substrate and the damper while irradiating the surface of the substrate.

2. The fluid handling system according to claim 1, further comprising a first valve configured to control the flow of fluid through the first extraction member and/or further comprising a second valve configured to control the flow of fluid through the second extraction member.

3. The fluid handling system according to claim 2, wherein the first extraction member is configured so that, in use, the fluid that flows through it substantially comprises immersion liquid and/or wherein the second extraction member is configured so that, in use, the fluid flow through it substantially consists of gas.

4. The fluid handling system according to claim 1, wherein:
the first extraction member comprises a first extraction conduit and a first extraction opening, wherein the first extraction conduit is configured to receive fluid extracted through the first extraction opening; and
the second extraction member comprises a second extraction conduit and a second extraction opening, wherein the second extraction conduit is configured to receive fluid extracted through the second extraction opening.

5. The fluid handling system according to claim 4, further comprising a third extraction conduit configured to receive the fluid from both the first extraction conduit and the second extraction conduit.

6. The fluid handling system according to claim 5, further comprising a third valve configured to control the flow of fluid through the third extraction conduit.

7. The fluid handling system according to claim 1, wherein the first extraction member is configured so that, in use, the fluid flow rate through it is substantially constant, and/or wherein the first extraction member is arranged so that, in use, the fluid flow rate through it is substantially the minimum flow rate capable of holding the meniscus stationary when there is no relative movement between the substrate and the fluid handling system.

8. The fluid handling system according to claim 1, wherein the damper, the first extraction member and/or the second extraction member are configured so that, in use, the meniscus moves along the surface of the damper in response to movement of the substrate relative to the fluid handling system, and/or wherein the length of the damper surface between the first extraction member and the second extraction member is between 1 mm and 100 mm, and/or wherein the surface of damper is configured so that it is substantially parallel to the surface of the substrate.

9. The fluid handling system according to claim 1, wherein:
a first end of the surface of the damper is at the first extraction member;
a second end of the surface of the damper is at the second extraction member; and
the surface of the damper is configured so that the separation between the surface of the damper and the surface of the substrate is larger, or smaller, at the second end than that at the first end.

10. The fluid handling system according to claim 9, wherein the surface of the damper is curved, slanted or wave shaped.

11. The fluid handling system according to claim 1, wherein the damper is a first damper; and
further comprising a second damper arranged on the other side of the first extraction member than the first damper and configured so that the immersion liquid is supported between a surface of the second damper and the surface of the substrate;
wherein the separation between at least part of the surface of the first damper and the surface of the substrate is greater than that the separation between at least part of the surface of the second damper and the surface of the substrate, and/or
wherein:
the fluid handling system comprises a fluid handling structure with an inner surface configured to confine the immersion liquid;
the first and second extraction members are located radially away from the inner surface of the fluid handling structure; and
the second extraction member is located further away from the inner surface of the fluid handling structure than the first extraction member.

12. The fluid handling system according to claim 1, wherein there are a plurality of first extraction members and/or wherein there are a plurality of second extraction members.

13. The fluid handling system according to claim 12, wherein there are a plurality of first extraction members and the plurality of first extraction members are arranged around a mid-point of the liquid confinement space.

14. The fluid handling system according to claim 12, wherein there are a plurality of second extraction members and the plurality of second extraction members are arranged around a mid-point of the liquid confinement space.

15. A lithographic apparatus comprising the fluid handling system of claim 1.

16. A fluid handling system for a lithographic apparatus, wherein the fluid handling system is configured to confine immersion liquid to a liquid confinement space between a part of a projection system and a surface of a substrate in the lithographic apparatus wherein a radiation beam projected from the projection system can irradiate the surface of the substrate by passing through the immersion liquid, the fluid handling system comprising:
a first extraction member configured to extract fluid;
a second extraction member configured to extract fluid;
a damper arranged between the first and second extraction members and configured to support a meniscus of the immersion liquid between a surface of the damper and the surface of the substrate,
wherein the damper, first extraction member and second extraction member are configured to limit movement of the meniscus to between the first and second extraction members during motions between the substrate and the damper while irradiating the surface of the substrate.

17. The fluid handling system according to claim 16, wherein the first extraction member is configured so that, in use, the fluid that flows through it substantially comprises immersion liquid and/or wherein the second extraction member is configured so that, in use, the fluid flow through it substantially consists of gas.

18. The fluid handling system according to claim 16, wherein the first extraction member is configured so that, in use, the fluid flow rate through it is substantially constant, and/or wherein the first extraction member is arranged so that, in use, the fluid flow rate through it is substantially the minimum flow rate capable of holding the meniscus stationary when there is no relative movement between the substrate and the fluid handling system.

19. The fluid handling system according to claim 16, wherein:
a first end of the surface of the damper is at the first extraction member;

a second end of the surface of the damper is at the second extraction member; and the surface of the damper is configured so that the separation between the surface of the damper and the surface of the substrate is larger, or smaller, at the second end than that at the first end.

20. A lithographic apparatus comprising the fluid handling system of claim 16.

* * * * *